United States Patent
Saito et al.

(10) Patent No.: US 6,452,812 B1
(45) Date of Patent: Sep. 17, 2002

(54) ELECTROMAGNETIC WAVE SHIELDING STRUCTURE

(75) Inventors: Satoshi Saito; Tomohiro Ikeda; Daiji Hotta, all of Shizuoka; Kazuyuki Shiraki; Masanori Wakui, both of Aichi, all of (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 10/050,042

(22) Filed: Jan. 17, 2002

(30) Foreign Application Priority Data

Jan. 17, 2001 (JP) ........................................ 2001-008361

(51) Int. Cl.[7] ................................................ H05K 9/00
(52) U.S. Cl. .................... 361/818; 174/117 F; 174/35 R
(58) Field of Search ............................ 174/35 R, 35 M, 174/53, 117 F, 117 FF, 36; 206/702, 719; 361/816, 818

(56) References Cited

U.S. PATENT DOCUMENTS

| | | | | |
|---|---|---|---|---|
| 1,746,299 A | * | 2/1930 | Berry ..................... | 174/102 D |
| 4,287,385 A | * | 9/1981 | Dombrowksy .......... | 174/105 R |
| 4,437,724 A | * | 3/1984 | Volka ......................... | 439/493 |
| 5,281,762 A | * | 1/1994 | Long et al. .............. | 174/117 F |
| 5,552,565 A | * | 9/1996 | Cartier et al. ............ | 174/117 F |
| 5,900,588 A | * | 5/1999 | Springer et al. ......... | 174/117 F |
| 6,043,434 A | * | 3/2000 | Prudhon ................. | 174/113 R |

\* cited by examiner

*Primary Examiner*—David Martin
*Assistant Examiner*—Thanh S. Phan
(74) *Attorney, Agent, or Firm*—Sughrue Mion, PLLC

(57) ABSTRACT

Electric contact portions that contact terminals are formed for a first holder, and pressing portions are formed for a second holder to press terminals against the electric contact portions. In addition, provided for the pressing portions are a pair of first position regulators, which contact, at two places in the widthwise direction of the terminals, the outer walls of the terminals, and a pair of second position regulators, which, in the longitudinal direction of the terminals, contact the ends of the terminals.

4 Claims, 6 Drawing Sheets

ELECTROMAGNETIC WAVE SHIELDING STRUCTURE

CROSS REFERENCE TO RELATED APPLICATION

The present application is based on Japanese Patent Application No. 2001-8361, the entire contents of which are incorporated herein by reference.

BACKGROUND OF THE INVENTION

1. Field of the Invention

The present invention relates to an electromagnetic wave shielding structure for connecting multiple shielded wires to a conductive ground member.

2. Related Art

To connect a power feed cable or control signal cable to an arbitrary electric device, including a motor mounted in a vehicle such as an electric car, normally, electromagnetic wave shielding is required. Electromagnetic wave shielding is performed in order to prevent the destabilization of the operation of the electric device due to various types of electrical noise.

A conventional electromagnetic wave shielding structure will now be explained while referring to FIGS. 6 and 7. For this shielding multiple shielded wires 101 are employed. These wires 101 are connected to a conductive ground member 105, such as a motor case, by multiple terminals 102 that are connected to the braided shields of the respective shielded wires 101, and a first holder 103 and a second holder 104 between which the terminals 102 are cramped. By using this arrangement, electromagnetic wave shielding can be provided.

The individual components will now be described. Each shielded wire 101 consists of a core line 106 surrounded by an insulating cover 107 and overlaid by a braided shield (not shown), and an outer cover 108 that encloses the braided shield (see FIG. 7). The shielded wire 101 obtained by the terminal process is employed, and a LAN terminal 109 is connected to the core line 106 through the terminal process. Further, the terminals 102 are connected to the braided shields (not shown).

Each of the terminals 102 includes a main terminal body 110 and a ring member 111, while an annular portion 112 and a braided shield folding portion (not shown) are formed for the main terminal body 110. The annular portion 112 is cramped by the first holder 103 and the second holder 104, and the braided shield (not shown) is folded over the braided shield folding portion (not shown). The ring member 111 is inserted into the outside of the folded over braided shield (not shown), and is caulked at a plurality of positions using a caulking device (not shown).

The fist holder 103, which is conductive, includes: a pair of fixed portions 113, which are securely connected to the grounding member 105; three electric contact portions 114, which have a spring property and which are formed into an arched shape; connecting portions 115, which are located between the fixed portions 113 and the electric contact portions 114; and flat connecting portions 116, which are located between the electric contact portions 114. Bolt through holes 17 are formed in the fixed potions 113 and the connecting portions 115 are formed by bending the fixed portions 113 and the electric contact portions 114, while the connecting portions 116 are formed parallel to the grounding member 105.

The second holder 104, which is conductive, includes: a pair of fixed potions 118, which are lapped over the fixed portions 113 of the first holder 103; three arched pressing portions 119, which press the terminals 102 against the corresponding electric contact portions 114; connecting portions 120, which are formed between the fixed portions 118 and the pressing portions 119; and flat connecting portions 121, which are formed between the pressure portions 119. Further, bolt through holes 123 are formed in the fixed portions 118 for the insertion of the bolts 122, and the pressing portions 119 have a curvature greater than that of the annular portions 112 of the terminals 102.

With this arrangement, the bolts 122 are inserted through the bolt through holes 123 and 117 and engage the grounding member 105. Then, the respective terminals 102 are cramped between the pressing portions 19 and the electric contact portions 114, and the shielded wires 101 are connected to the ground member 105. In this manner, electromagnetic wave shielding is provided.

According to the conventional technique, however, the following four problems with the second holder 104 have arisen.

Since the pressing portions 119 are arched and have a curvature greater than that provided for the annular portions 112 of the terminals 102, when due to a specific factor an external force is applied to the terminals 102 in the direction indicated by an arrow P in FIG. 8, that is, widthwise relative to the terminals 102. The terminals 102, which are held so that they closely contact the electric contact portions 114 by the spring force thereof, may be shifted from their predetermined locations (since each terminal 102 respectively contacts, at only one location each, the electric contact portion 114 and the pressing portion 119, a terminal 102 may be shifted from its predetermined location upon the application of an external force in the direction indicated by the arrow P).

Further, since the pressing portions 119 are simply curved, when due to a specific factor the external force is exerted on the terminals 102 in the direction indicated by an arrow Q in FIG. 9, which is the longitudinal direction of the terminal 102, the terminals 102 may also be shifted in the direction indicated by the arrow Q.

In addition, since the contact load imposed on the terminals 102 and the electric contact portions 114 must be equalized, forming the pressing portion 19 into the arched shape required to press the terminals 102 against the electric contact portions 114 is not easy. As a result, this has an adverse effect on the manufacturing costs.

Furthermore, since a satisfactory rigidity is required to press the terminals 102 against the electric contact portions 114, the thicknesses of the members are increased.

SUMMARY OF THE INVENTION

To solve the above shortcomings, it is one objective of the present invention to provide an electromagnetic wave shielding structure that can prevent the shifting of grounding terminals that are cramped between a first holder and a second holder, and that can reduce both the manufacturing costs of a second holder and the weight thereof.

To achieve the above objective, according to a first aspect of the invention, there is provided an electromagnetic wave shielding structure comprising: A shielded wire; a terminal connected to a braided shield of the shielded wire, the terminal is cramped between a first holder and a second holder; the first holder including electric contact portion; the second holder including pressing portion, the pressing portion having a pair of first position regulators and a pair of second position regulators; and a conductive ground member provided so that the shielded wire is connected to the conductive ground member through the terminal and the first holder and the second holder, wherein the electric contact portion contacts the terminal, and the pressing portion presses the terminal against the electric contact portion, and wherein the pair of first regulators contact an outer wall of the terminal in the widthwise direction of the terminal at two places, and a pair of second position regulators contact both ends of the terminal in the longitudinal direction of the terminal.

According to a second aspect of the invention, for the electromagnetic wave shielding structure of the first aspect, the pressing portion is formed in a plate shape.

According to a third aspect of the invention, for the electromagnetic wave shielding structure of the second aspect, a reinforcement rib is formed on the pressing portion.

According to a fourth aspect of the invention, for the electromagnetic wave shielding structure of the first aspect, the pressing portion is provided with a substantially rectangular opening and the pair of first position regulators and the pair of second regulators are formed at edges of the opening.

According to the first aspect of the invention, when the terminals are cramped between the first holder and the second holder, the secured state of the terminals is as follows. A terminal is held at three different positions whereat it is contacted, once each, by either one of the first position regulators or the electric contact portion. Thus, the shifting of the terminal can be satisfactorily prevented when an external force is applied in the widthwise direction. Further, since the terminal is positioned so that at both ends it is secured to one of the regulators of the second position regulator pair, the shifting of the terminal can also be satisfactorily prevented when an external force is applied in the longitudinal direction.

According to the second aspect of the invention, since the pressing portions are flat plates, the manufacturing of the second holder is improved. And furthermore, according to the third aspect of the invention, since the pressing portions include reinforcement ribs, the rigidity of the second holder can be maintained even when the weight of the second holder is reduced.

DETAILED DESCRIPTION OF THE PREFERRED EMBODIMENTS

The preferred embodiment of the invention will now be described while referring to the accompanying drawings.

Figure 1:
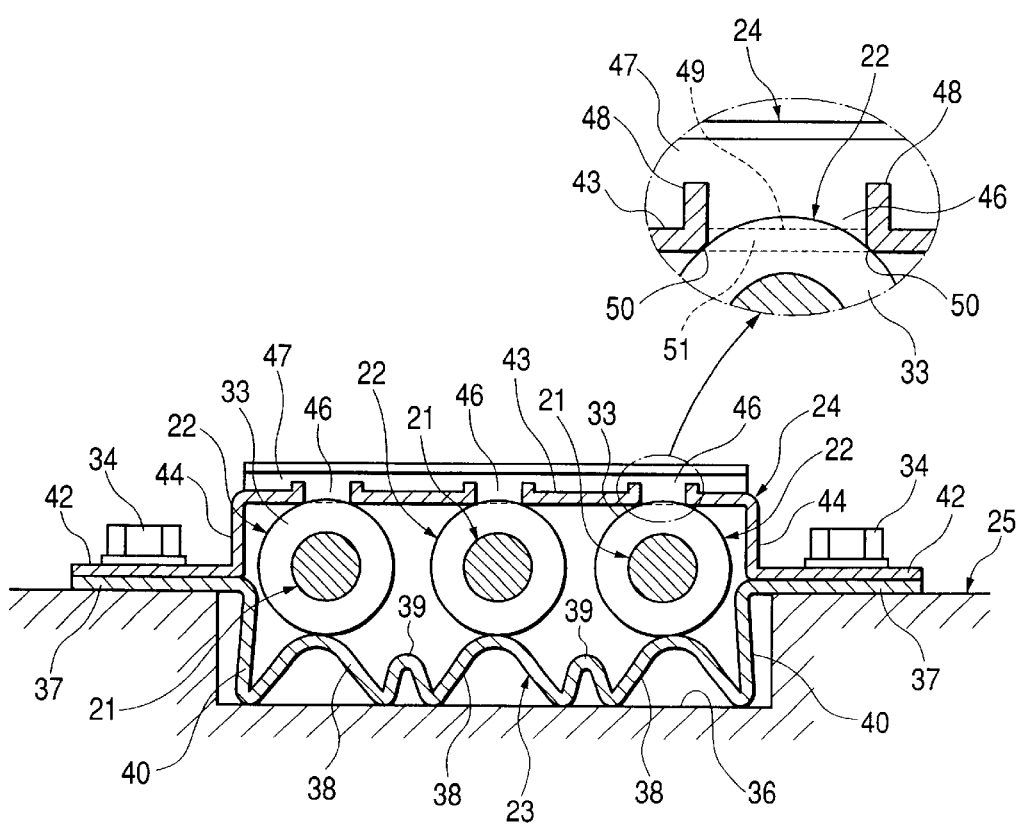
FIG. 1 is a cross-sectional view of an electromagnetic shielding structure according to one embodiment of the present invention.
Figure 2:
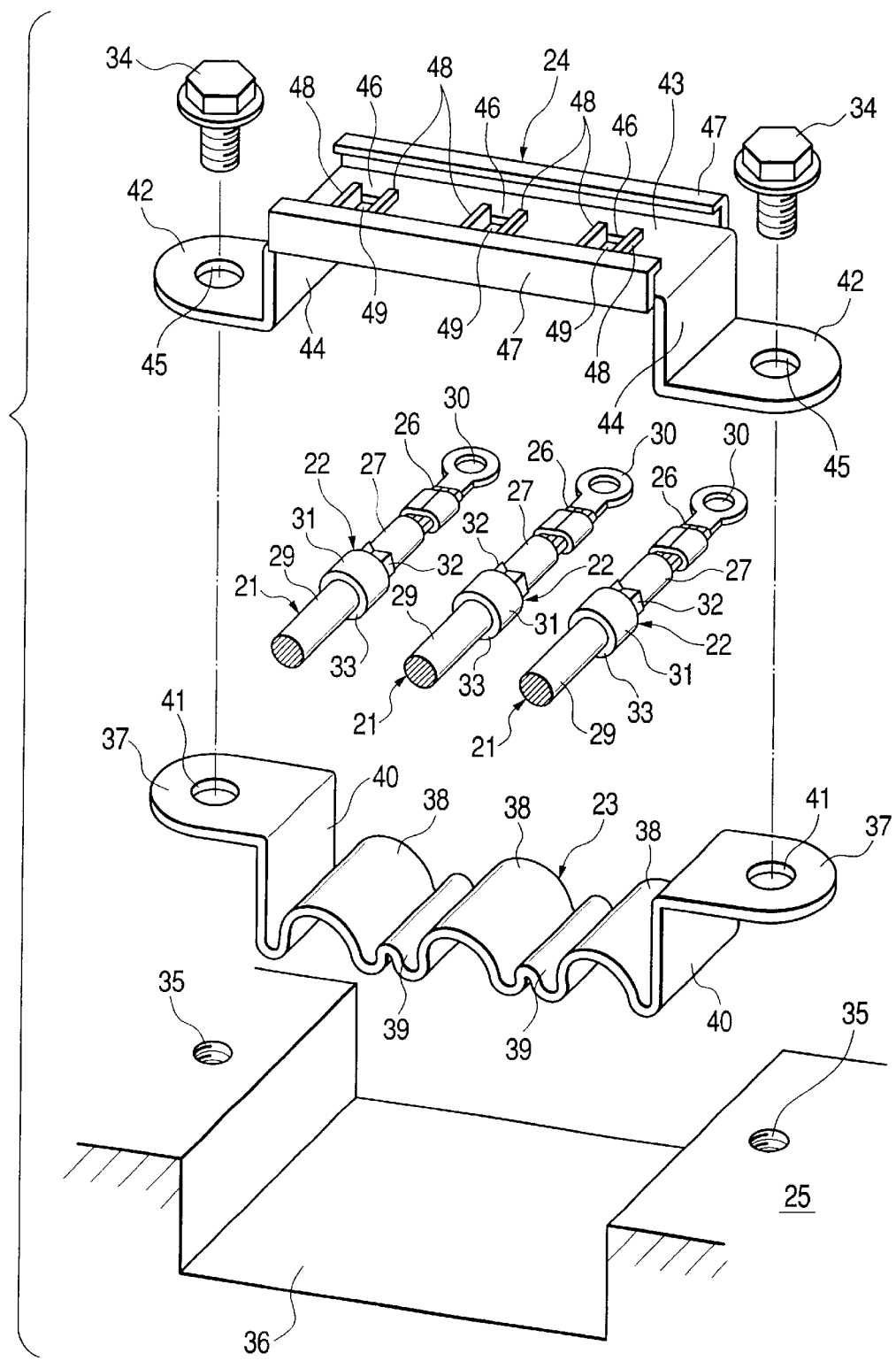
FIG. 2 is an exploded perspective view of the structure in FIG. 1.
Figure 3:
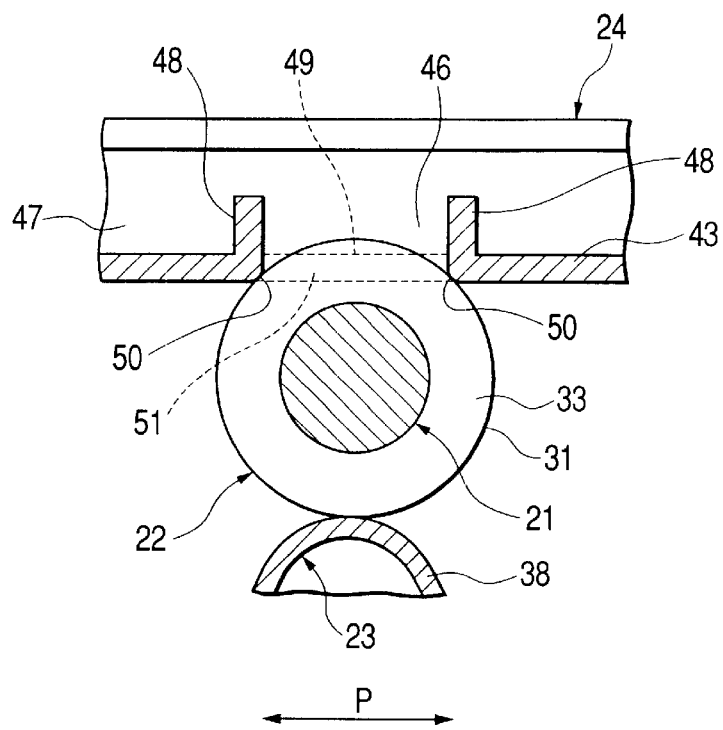
FIG. 3 is an enlarged view of the essential portion in FIG. 1.
Figure 4:
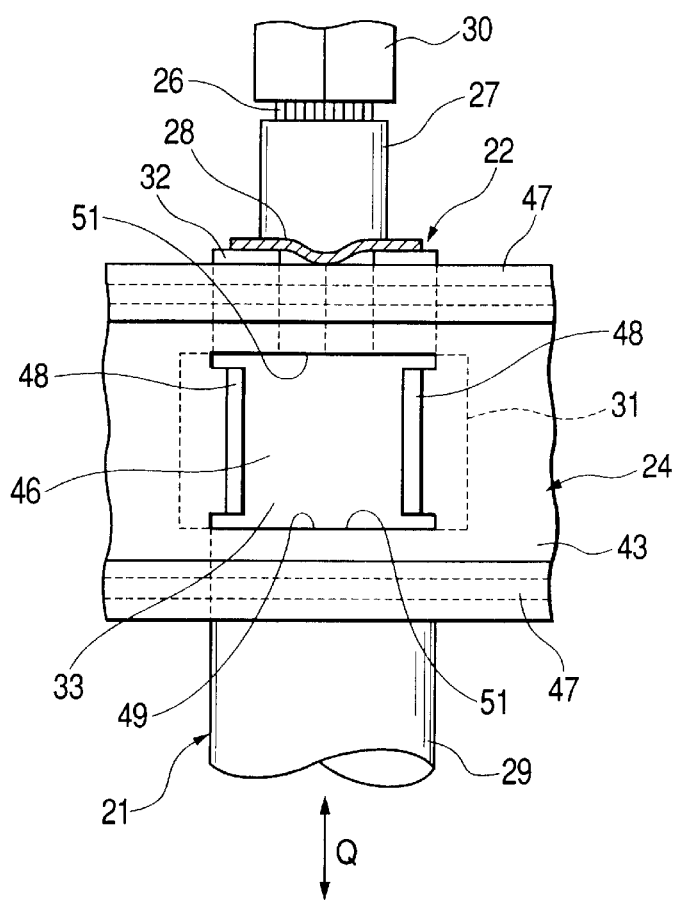
FIG. 4 is a plan view of the structure in FIG. 1.

FIG. 1 is a cross-sectional view of an electromagnetic wave shielding structure according to one embodiment of the present invention. FIG. 2 is an exploded perspective view of the electromagnetic wave shielding structure in FIG. 1. FIG. 3 is an enlarged view of the essential portion of the structure in FIG. 1. FIG. 4 is a plan view of the structure in FIG. 1.

In FIGS. 1 and 2, the electromagnetic wave shielding structure of the invention comprises: multiple shielded wires 21; multiple terminals 22; a first holder 23 and a second holder 24, both of which are conductors; and a grounding member 25. The respective terminals 22, which are connected to the braided shields of the shielded wires 21, are cramped by the first and second holders 23 and 24 and are grounded by being to connected to the grounding member 25. In this manner, electromagnetic wave shielding is implemented.

Figure 7:
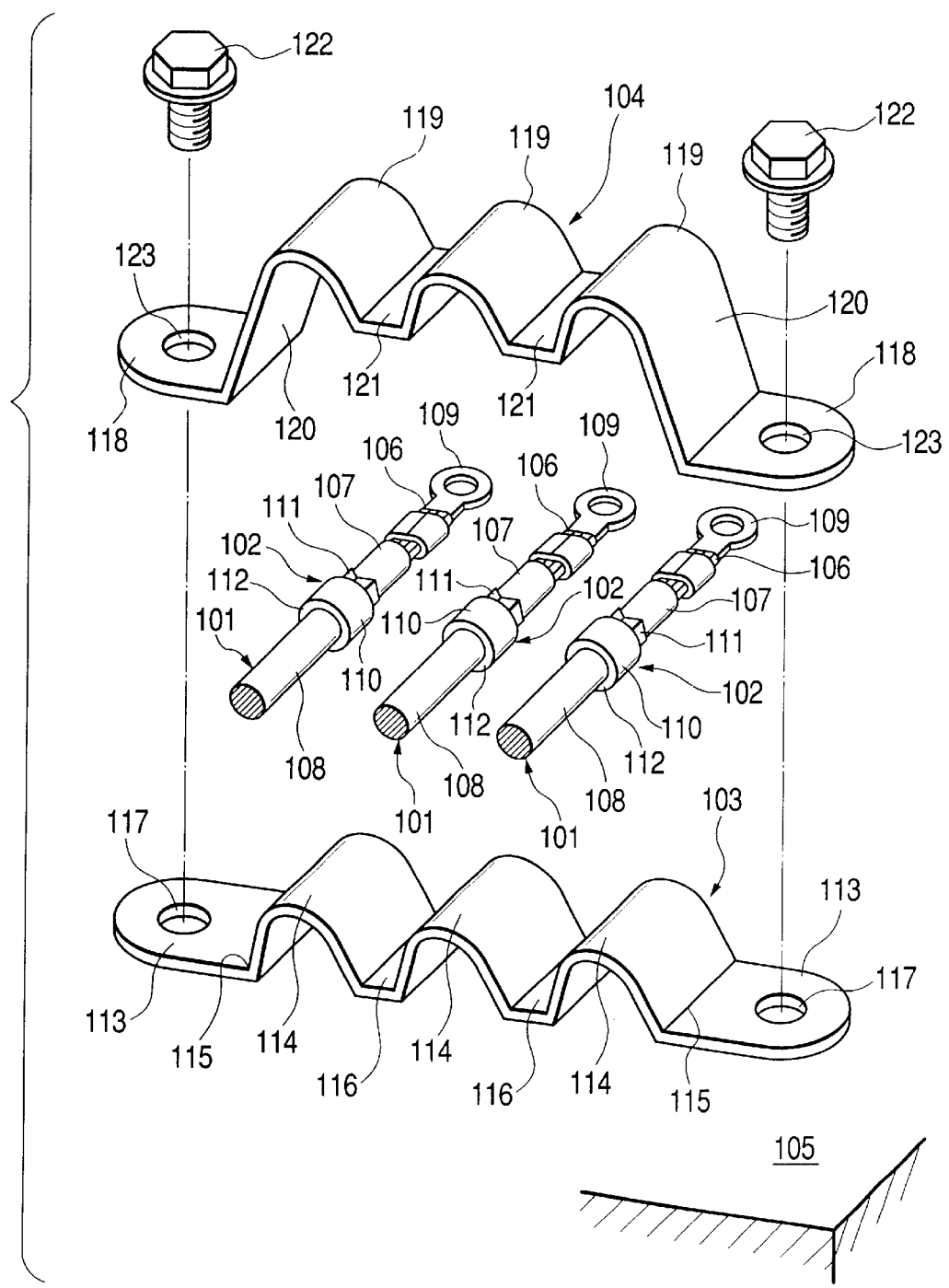
FIG. 7 is an exploded perspective view of the structure in FIG. 6.
Figure 8:
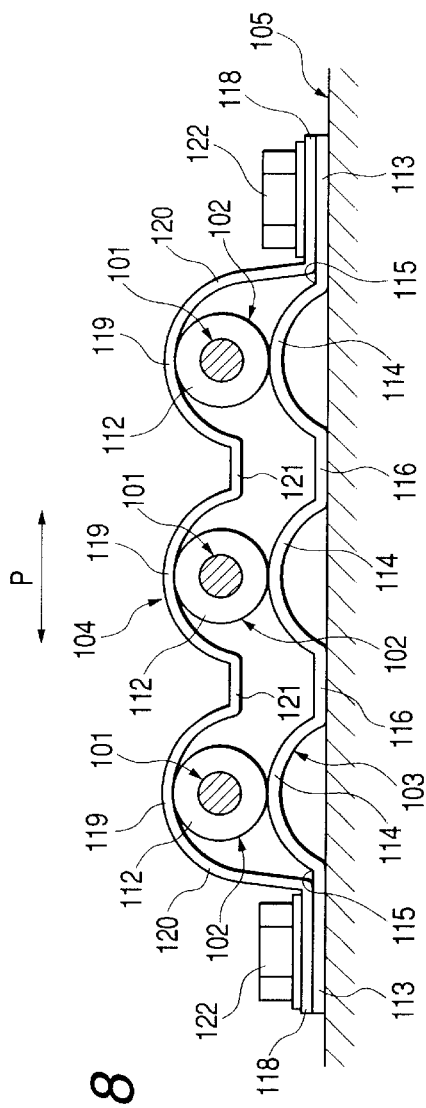
FIG. 8 is a front view for explaining the shifting of terminals (in the widthwise direction of the terminals)
Figure 9:
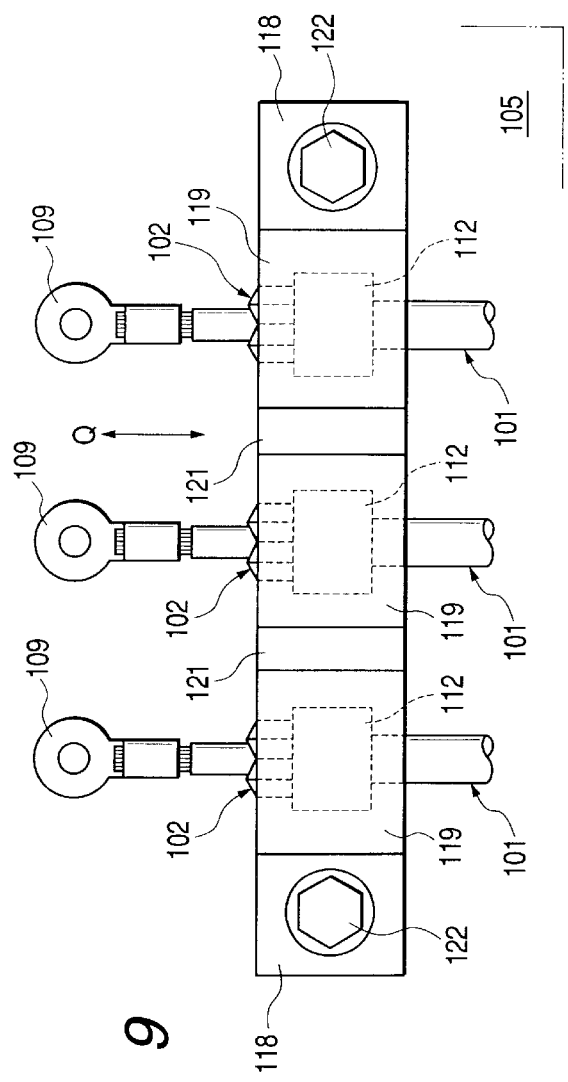
FIG. 9 is a flat view for explaining the shifting of terminals (in the longitudinal direction of the terminals).

The shielded wires 21 each consist of a core line 26 surrounded by an insulating cover 27 on which a braided shield 28 (see FIG. 4; it may simply be called a shield) is overlaid, and an outer cover 29 that encloses the braided shield 28 (this structure is the same as the shielded wire 101 explained in the related art (see FIG. 7)). The terminal process has been performed for each shielded wire 21. An LA terminal 30, for example, is connected to the exposed core line 26, and for grounding, a terminal 22 is connected to the braided shield 28 (see FIG. 4).

The terminal 22 is the same as the terminal 102 explained in the related art (see FIG. 7), and includes a main terminal body 31 and a ring member 32. The main body 31 has an annular portion 33 and a cylindrical braided shield folding portion (not shown), and the annular portion 33 is cramped by the first and the second holders 23 and 24. The braided shield folding portion (not shown) is so arranged that a folded over portion of the braided shield 28 (see FIG. 4) is disposed around its circumference, while the ring member 32 is fitted around the outside of the folded over portion of the braided shield 28 (see FIG. 4). The annular portion 33 has end faces in the longitudinal direction of the terminal 22, which corresponds to the direction in which the shielded wire 21 is extended or the direction in which the shielded wire 21 is inserted.

To provide the thus structured terminal 22, the main terminal body 31 is inserted into the terminal of the shielded wire 21 where the braided shield 28 (see FIG. 4), the insulating cover 27 and the core line 26 are exposed, and the braided shield 28 (see FIG. 4) is folded back toward the braided shield folding portion (not shown). Then, the ring member 32 is fitted over the outer wall, and is caulked at a plurality of places using a caulking device (not shown).

The grounding member 25 is a metal conductive case for an arbitrary electric device, including a motor mounted on a vehicle, such as an electric car, and screw holes 35 for engaging bolts 34 are formed on one flat surface of the grounding member 25. Further, recessed portions 36 are formed in the flat surface of the grounding member 25 between the screw holes 35 to accommodate electric contact portions 38, first connecting portions 39 and second connecting portions 40 of the first holder 23, which will be described later. The interval between recessed portions 36 is designated so as to permit the deflection of the second connecting portions 40, which will be described later, and the depth of the recessed portion 36 is designated in accordance with the distance of the deflection of the second connecting portion 36. It should be noted that paired pillar members may be formed on the flat surface to function in the same manner as the recessed portion 36.

The first holder 23 is formed by punching a thin metal plate conductor to produce substantially a strip shape and then folding the strip at predetermined positions, and includes a pair of fixing portions 37, which are securely fixed to the grounding member 25; a plurality of arched resilient electric contact portions 38; a plurality of resilient first connecting portions 39, which are formed between the electric contact portions 38; and a pair of resilient second connecting portions 40, which are formed between the electric contact portions 38 and the fixing portions 37. It should be noted that, in this embodiment, three electric contact portions 38 are formed. (The number of electric contact portions 38 is not limited to three. Since the electric contact portions 38 are formed in accordance with the number of the shielded power lines 21 or the terminals 22, one or four or more electric contact portions may be formed).

Fixing portions 37 are arranged at either end of the first holder 23, and have full face contact with the flat surface of the grounding member 25. Formed substantially in the centers of the fixing portions 37 are bolt through holes 41 through which bolts 34 are inserted.

As is described above, the electric contact portions 38 that are formed have arched shapes, i.e., have, in a front view, inverted U shapes, with the widths of the Us narrowing as the distance from the bottom of the recessed portion 36 of the grounding member 25 increases). The electric contact portions 38 are arranged at a constant interval.

The first connecting portions 39 that are formed have, in the front view, inverted U shapes, so that the centers of the first connecting portions 39 are raised in the direction in which the electric contact portions 38 are bent. (The height of a raised portion and the interval between its ends are smaller than are those of an electric contact portion 38. Further, the first connecting portions 39 may also be formed so that in the front view they have inverted V shapes.) Further, the first connecting portions 39 are resilient which enables the terminals to approach each other. The portions at which the first connecting portions 39 are coupled with the electric contact portions 38 are so arranged that they contact the bottom of a recessed portion 36 (it is preferable that the connecting portions slide where they contact the bottom and that to reduce their resistance to sliding the connecting portions be curved).

The second connecting portions 40 are so arranged that a height difference is defined between the fixed portions 37 and the electric contact portions 38. That is, ends of the second connecting portion 40 abut against the bottom of the recessed portion 36, while the other ends are located at the sides of the entrance to the recessed portion 36. Further, the second connecting portions 40 are formed so they are parallel to the side faces of the recessed portion 36 before the terminals 22 are cramped. The portions whereat the second connecting portions 40 are coupled with the electric contact portions 38 are formed so they contact the bottom of the recessed portion 36 (it is preferable that the coupled portions slide where they contact the bottom and that the faces where the portions 40 and 38 are connected be curved to reduce resistance to sliding). It should be noted that the second connecting portions 40 are substantially located at a distance from the side faces of the recessed portions 36.

As is the first holder 23, the second holder 24 is formed by punching a thin metal plate conductor to produce a strip shape, and then bending the strip at predetermined positions, and includes: a pair of fixed portions 42, which overlap the fixed portions 37 of the first holder 23; a pressing portion 43, which presses the terminals 22 against corresponding electric contact portions 38; and a pair of connecting portions 44, which are formed between the fixed portions 42 and the pressing portion 43.

The fixed portions 42 are located at either end of the second holder 24, and bolt through holes 45 for insertion of bolts 34 are formed substantially in their centers 42.

The pressing portion 43 is formed like a plate, and includes three terminal contacts 46 and a pair of reinforcement ribs 47 (when the. pressing portion 43 is formed like a plate greater manufacturing efficiency is achieved than is possible in the conventional case (manufacturing costs can be reduced)).

Each of the terminal contacts 46 is formed of a pair of contact pieces 48 which are raised upright by cutting; and a rectangular opening 49 is formed in the contact piece 48. With this arrangement, the annular portions 33 of the terminals 22 can be partially inserted between the terminal contacts 46.

At the root portions of the contact pieces 48 which are rounded, first position regulators 50 are located that contact the outer walls of the annular portions 33 when they are inserted. That is, a first position regulator 50 contacts, at two places, the outer wall of the annular portion 33 of the terminal 22 in the widthwise direction of the terminal 22. It should be noted that the wall of a first position regulator 50 may abut against the entire surface of the contact pieces 48 (the entire faces of the contact pieces 48 that the annular portion 33 contacts). Further, instead of the contact pieces 48 being formed, first position regulators 50 may simply be formed at the edge of the opening 49 In the widthwise direction.

At the edges of the opening 49 in the longitudinal direction, second position regulators 51 (see FIG. 4) are so arranged that when the end faces of the annular portions 33 are inserted and contact the second position regulators 51, the second position regulators 51 inhibit the displacement of the end faces. That is, the second position regulators 51 (see FIG. 4) inhibit the movement of the terminals 22 in the longitudinal direction.

The ribs 47 are formed substantially in L shapes in cross section (the ribs 47 are not limited to this shape), and reinforce the pressing portion 43 in order to increase its rigidity. Since these ribs 47 are formed, the second holder 24 can be thinner and the weight thereof can be reduced. It should be noted that the formation of the ribs 47 is an arbitrary requirement.

With this arrangement, the following example procedures are employed to connect the shielded power lines 21 to the grounding member 25 and to implement the electromagnetic wave shielding of the invention.

First, the first holder 23 is mounted on the grounding member 25 (the electric contact portions 38, the first connecting portions 39 and the second connecting portions 40 are accommodated in the recessed portion 36). Then, while a person holds the three shielded power lines 21 in one hand, the terminals 22 are mounted on their corresponding electric contact portions 38, while the second holder 24, held in the other hand of the person, is laid over the first holder 23. At this time, the terminals 22 are cramped between the electric contact portions 38 and the corresponding terminal contacts 46 of the pressing portion 43. Finally, the bolts 34 are inserted through the bolt through holes 41 and 45, and are screwed in and secured in the screw holes 35 of the grounding member 25. As a result, the terminals 22 are cramped between the first and second holders 23 and 24 while the shielded power lines 21 are connected to the grounding member 25.

Since the second holder 24 is drawn down and gradually nears the first holder 24 as the bolts 34 are screwed into the screw holes 35, the first holder 23, individual parts of which are resilient, responds to the increasing pressure as follows.

When the engagement of the bolts 34 is initiated, a load (vertical load) is imposed at the terminals 22 on the portions of the electric contact portions 38 that they contact, and a horizontal load, generated by the dispersion of the vertical load, is imposed at both ends of each electric contact portion 38. As the bolts 34 are gradually tightened, the first and second connecting portions 39 and 40 are deflected by the horizontal load, so that each of the ends of the first connecting portions 39 approach each other and the interval between the ends of the second connecting portion 40 is increased. Further, the interval between the ends of each of the electric contact portions 38 is increased in accordance with the distances the first and second connecting portions 39 and 40 are deflected. Therefore, the locations of the bottom surfaces of the electric contact portions 38 that contact the terminals 22 are moved toward the bottom of the recessed portion 36 in the grounding member 25. when the first and second connecting portions 39 and 40 are satisfactorily deflected and the bolts 34 are fully engaged, the electric contact portions 38 are bent flexibly because of their resiliency.

When the terminals 22 have been cramped between the first and second holders 23 and 24, the state of the terminals 22 that are thus held is as follows. As is shown in FIG. 3, the annular portion 33 of each terminal 22 is held at three places where it contacts the first position regulator 50 and the summit of the electric contact portion 38. Therefore, compared with the conventional arrangement, the terminal 22 is better inhibited from being displaced even when, due to a specific factor, an external force is exerted in the direction indicated by an arrow P. Further, as is shown in FIG. 4, the annular portion 33 of the terminal 22 is stably retained while its end faces contact and are held by the annular portion 33. Thus, even when, due to a specific factor, an external force is exerted against the terminals 22 in the direction indicated by an arrow Q, the terminals 22 can be prevented from shifted more than is necessary.

Figure 5:
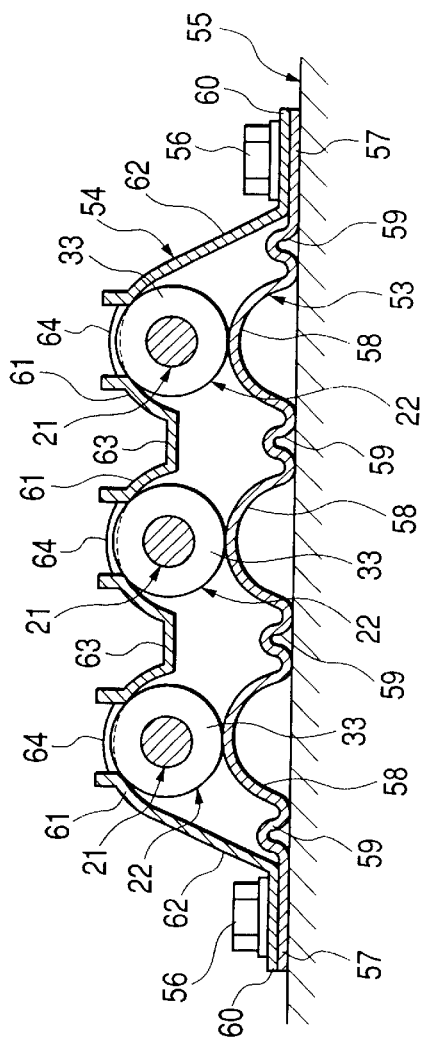
FIG. 5 is a cross-sectional view of an electromagnetic wave shielding structure that employs another example second holder.
Figure 6:
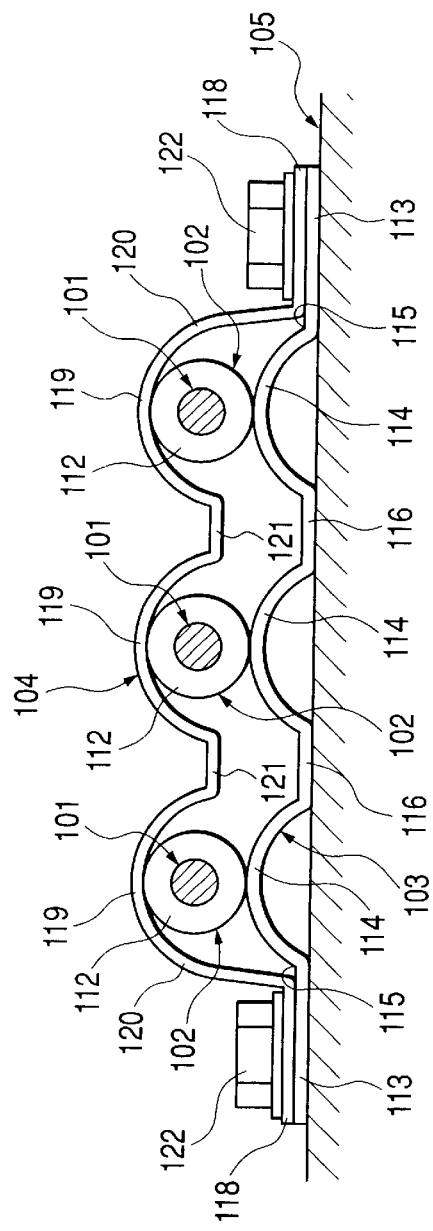
FIG. 6 is a front view of a conventional electromagnetic wave shielding structure.

The present invention can be variously modified without departing from the scope of the invention. Specifically, when as in FIG. 5 a first holder 53 and a second holder 54 are employed as shown to connect the shielded wires 21 to a grounding member 55, the above described effects can be obtained and the wires 21 can be prevented from being shifted.

The grounding member 55 is a conductive metal case for an electric device, including a motor that is mounted on a vehicle such as an electric car. Screw holes (not shown) for the insertion of bolts 56 are, for example, formed in the flat surface of the grounding member 55.

The first holder 53 is formed by punching to produce a thin metal strip shaped plate conductor and by bending the strip at predetermined positions, and includes: a pair of fixing portions 57, which are securely connected to the grounding member 55; a plurality of arched resilient electric contact portions 58; and a plurality of connecting portions 59, which are formed between the fixed portions 57 and the electric contact portions 58, and between the electric contact portions 58.

The fixing portions 57 are the portions that are located at either end of the first holder 53, and are in full face contact with the flat surface of the grounding member 55. Bolt through holes (not shown) for the insertion of the bolts 56 are formed almost in the center of the fixing portions 57.

As is described above, the electric contact portions 58 are formed in an arched shape, i.e., in an inverted U shape in the front view, so that as the distance from the flat surface of the grounding member is increased, the width of the U shape is reduced. In addition, the electric contact portions 58 are arranged at equal pitches.

The connecting portions 59 are formed, in the front views, substantially in an inverted U shape, so that the connecting portions 59 are circumferentially raised relative to the direction in which the electric contact portions 58 are curved (the heights of the raised portions and the intervals between the ends are considerably smaller than are those provided for the shaping of the electric contact portion 58 (in the front view, the connecting portions 59 may be formed substantially in a V shape). The connecting portions 59 are resilient so that the ends of the connecting portion 59 can approach each other.

As is the first holder 53, the second holder 54 is formed by punching to produce a thin metal strip shaped plate conductor, and by ending the strip at predetermined positions, and includes: a pair of fixing portions 60, which are laid over the fixed portions 57 of the first holder; arched pressing portions 61, which press the terminals 22 against the corresponding electric contact portions 58; connecting portions 62, which are formed between the fixed portions 60 and the pressing potions 61, near the ends; and flat connecting portions 63, which are located between the pressing portions 61.

The fixed portions 60 are located at either end of the second holder 54, and bolt through holes (not shown) for the insertion of the bolts 56 are formed substantially in the center of the fixing portions 60.

The connecting portions 62 are arranged so that they are extended obliquely upward, and the connecting portions 63 are formed so that they are parallel to the flat surface of the grounding member 55.

The pressing portions 61, in the front view, are formed in almost an inverted U shape, and are curved more than are the annular portions 33 of the terminals 22, so that the portions 61 are raised in the direction in which the electric contact portions 58 are curved. Further, the pressing portions 61 include terminal contacts 64 that have the same structure as the terminal contacts 46 (see FIG. 3).

With this arrangement, when cramped between the first and second holders 53 and 54, the terminals 22 are held while the annular portions 33 of the terminal 22 are partially inserted into the terminal contacts 64 of the second holder 54. As a result, the shifting of their positions can be prevented.

As is described above, according to the first aspect of the invention, a terminal is held at three different positions whereat it is contacted, once each, by either one of the two first position regulators or the electric contact portion. Further, a terminal can also be held while at either end it contacts to a second position regulator. Therefore, an electromagnetic wave shielding structure that can also prevent the shifting of the terminals can be provided.

According to the second aspect of the invention, since the pressing portions are flat, the manufacturing process for the second holder is improved, and the manufacturing costs for the second holder can therefore be reduced.

According to the third aspect of the invention, since the pressing portions include a reinforcement rib, the rigidity of the second holder can be maintained even while the weight of the second holder is reduced. Therefore, a reduction in the weight of the second holder is implemented.

What is claimed is:

1. An electromagnetic wave shielding structure comprising:
    a shielded wire;
    a terminal connected to a braided shield of said shielded wire, said terminal is cramped between a first holder and a second holder;
    said first holder including an electric contact portion;
    said second holder including a pressing portion, said pressing portion having a pair of first position regulators and a pair of second position regulators; and
    a conductive ground member connected to said shielded wire through said terminal and said first holder and said second holder;
    wherein said electric contact portion contacts said terminal, and said pressing portion presses said terminal against said electric contact portion, and
    wherein said pair of first regulators contact an outer wall of said terminal at two places in the widthwise direction of said terminal, and said pair of second position regulators contact both ends of said terminal in the longitudinal direction of said terminal.

2. An electromagnetic wave shielding structure according to claim 1, wherein said pressing portion is formed in a plate shape.

3. An electromagnetic wave shielding structure according to claim 2, wherein a reinforcement rib is formed on said pressing portion.

4. An electromagnetic wave shielding structure according to claim 1, wherein said pressing portion is provided with a substantially rectangular opening and said pair of first position regulators and said pair of second regulators are formed at edges of said opening.

* * * * *